United States Patent
Kim et al.

(10) Patent No.: US 9,251,878 B2
(45) Date of Patent: Feb. 2, 2016

(54) NONVOLATILE MEMORY DEVICE AND RELATED WORDLINE DRIVING METHOD

(71) Applicants: Su-Yong Kim, Hwaseong-Si (KR); Jinyub Lee, Seoul (KR); Seungjae Lee, Hwaseong-Si (KR)

(72) Inventors: Su-Yong Kim, Hwaseong-Si (KR); Jinyub Lee, Seoul (KR); Seungjae Lee, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/257,072

(22) Filed: Apr. 21, 2014

(65) Prior Publication Data

US 2015/0055430 A1 Feb. 26, 2015

(30) Foreign Application Priority Data

Aug. 26, 2013 (KR) .................. 10-2013-0101221

(51) Int. Cl.
| | |
|---|---|
| G11C 16/06 | (2006.01) |
| G11C 8/08 | (2006.01) |
| G11C 11/408 | (2006.01) |
| G11C 16/08 | (2006.01) |

(52) U.S. Cl.
CPC .............. *G11C 8/08* (2013.01); *G11C 11/4085* (2013.01); *G11C 16/08* (2013.01)

(58) Field of Classification Search
CPC .................................................. G11C 11/4085
USPC ....................................................... 365/185.23
See application file for complete search history.

(56) References Cited

U.S. PATENT DOCUMENTS

| | | | |
|---|---|---|---|
| 6,141,250 A | 10/2000 | Kashimura | |
| 6,731,540 B2* | 5/2004 | Lee et al. ............... | 365/185.17 |
| 6,950,336 B2 | 9/2005 | Sowards et al. | |
| 7,016,233 B2 | 3/2006 | Kuo | |
| 7,495,958 B2 | 2/2009 | Chih | |
| 7,808,838 B2 | 10/2010 | Kim et al. | |
| 7,933,154 B2 | 4/2011 | Kang et al. | |
| 8,295,092 B2 | 10/2012 | Kim et al. | |
| 8,477,532 B2 | 7/2013 | Im | |
| 8,867,299 B2* | 10/2014 | Ryu et al. ............... | 365/230.03 |
| 2006/0203550 A1* | 9/2006 | Lee ........................ | 365/185.13 |
| 2007/0183207 A1* | 8/2007 | Park ....................... | 365/185.22 |
| 2008/0239810 A1 | 10/2008 | Lee | |
| 2009/0161437 A1 | 6/2009 | Pyeon et al. | |
| 2009/0231919 A1* | 9/2009 | Won et al. .............. | 365/185.13 |
| 2012/0257452 A1 | 10/2012 | Kim et al. | |
| 2013/0107654 A1* | 5/2013 | Kang ...................... | 365/226 |

FOREIGN PATENT DOCUMENTS

| | | |
|---|---|---|
| KR | 10-0854908 B1 | 8/2008 |
| KR | 10-0855270 B1 | 8/2008 |
| KR | 10-0909626 B1 | 4/2009 |
| KR | 10-2010-0082046 A | 7/2010 |
| KR | 10-2010-0105538 A | 9/2010 |

* cited by examiner

*Primary Examiner* — Son Mai
(74) *Attorney, Agent, or Firm* — Volentine & Whitt, PLLC

(57) ABSTRACT

A nonvolatile memory device comprises multiple memory blocks each comprising multiple memory cells arranged at intersections of wordlines and bitlines, an address decoder configured to electrically connect first lines to wordlines of one of the memory blocks in response to an address, a line selection switch circuit configured to electrically connect the first lines to second lines in different configurations according to the address, a first line decoder configured to provide the second lines with wordline voltages needed for driving, and a voltage generator configured to generate the wordline voltages.

15 Claims, 16 Drawing Sheets

NONVOLATILE MEMORY DEVICE AND RELATED WORDLINE DRIVING METHOD

CROSS-REFERENCE TO RELATED APPLICATIONS

This application claims priority under 35 U.S.C. §119 to Korean Patent Application No. 10-2013-0101221 filed Aug. 26, 2013, the subject matter of which is hereby incorporated by reference.

BACKGROUND OF THE INVENTION

The inventive concept relates generally to nonvolatile memory devices and related methods of operation. More particularly, certain embodiments of the inventive concept relate to nonvolatile memory devices and related wordline driving methods.

Semiconductor memory devices can be roughly divided into two categories according to whether they retain stored data when disconnected from power. These categories include volatile semiconductor memory devices, which lose stored data when disconnected from power, and nonvolatile semiconductor memory devices, which retain stored data when disconnected from power. Examples of volatile semiconductor memory devices include dynamic random access memory (DRAM) and static random access memory (SRAM), and examples of nonvolatile semiconductor memory devices include read only memory (ROM), flash memory, magnetoresistive random access memory (MRAM), and phase change random access memory (PRAM).

Nonvolatile semiconductor memory devices allow data to be stored in permanent or reprogrammable fashion, depending on the fabrication technology used. They can be used for user data, programs, and microcode storage in a wide variety of applications in the computer, avionics, telecommunications, and consumer electronics industries.

There is a continuing demand for nonvolatile semiconductor memory devices having improved qualities, such as better performance, lower cost, higher reliability. Accordingly, researchers are engaged in ongoing efforts to improve these and other aspects of nonvolatile semiconductor memory devices.

SUMMARY OF THE INVENTION

In one embodiment of the inventive concept, a nonvolatile memory device comprises multiple memory blocks each comprising multiple memory cells arranged at intersections of wordlines and bitlines, an address decoder configured to electrically connect first lines to wordlines of one of the memory blocks in response to an address, a line selection switch circuit configured to electrically connect the first lines to second lines in different configurations according to the address, a first line decoder configured to provide the second lines with wordline voltages needed for driving, and a voltage generator configured to generate the wordline voltages.

In another embodiment of the inventive concept, a nonvolatile memory device comprises multiple memory blocks each comprising multiple memory cells arranged at intersections of wordlines and bitlines, a first address decoder configured to electrically connect first lines to wordlines of one of even-numbered memory blocks of the memory blocks according to an address, a second address decoder configured to electrically connect the first lines to wordlines of one of odd-numbered memory blocks of the memory blocks according to the address, a first line selection switch circuit configured to electrically connect the first lines of the first address decoder to second lines, a second line selection switch circuit configured to electrically connect second lines of the second address decoder to the second lines, a line converter configured to electrically connect the second lines to third lines in different configurations according to the address, a first line decoder configured to provide the third lines with wordline voltages needed for driving, and a voltage generator configured to generate the wordline voltages.

In another embodiment of the inventive concept, a nonvolatile memory device comprises multiple memory blocks each comprising multiple memory cells arranged at intersections of wordlines and bitlines, a first address decoder configured to electrically connect first lines to wordlines of one of even-numbered memory blocks of the memory blocks according to an address, a second address decoder configured to electrically connect the first lines to wordlines of one of odd-numbered memory blocks of the memory blocks according to the address, a first line selection switch circuit configured to electrically connect the first lines of the first address decoder to second lines, a second line selection switch circuit configured to electrically connect second lines of the second address decoder to the second lines, a first line decoder configured to provide the second lines with wordline voltages for driving, and a voltage generator configured to generate the wordline voltages.

In another embodiment of the inventive concept, a method of operating a nonvolatile memory device comprises generating wordline voltages, applying the wordline voltages to source lines, electrically connecting the source lines to source interface lines in different configurations according to different addresses, and connecting the source interface lines to wordlines of different memory blocks corresponding to the different addresses.

In another embodiment of the inventive concept, an apparatus for controlling a nonvolatile memory device comprises an address decoder configured to electrically connect first lines to wordlines of one of multiple memory blocks of the nonvolatile memory device in response to an address, a line selection switch circuit configured to electrically connect the first lines to second lines in different configurations according to the address, a first line decoder configured to provide the second lines with wordline voltages needed for driving, and a voltage generator configured to generate the wordline voltages.

These and other embodiments of the inventive concept can improve the flexibility of nonvolatile memory operations by increasing the number of degrees of freedom of wordline voltages applied to source lines.

BRIEF DESCRIPTION OF THE DRAWINGS

The drawings illustrate selected embodiments of the inventive concept. In the drawings, like reference numbers indicate like features.

DETAILED DESCRIPTION

Figure 1:
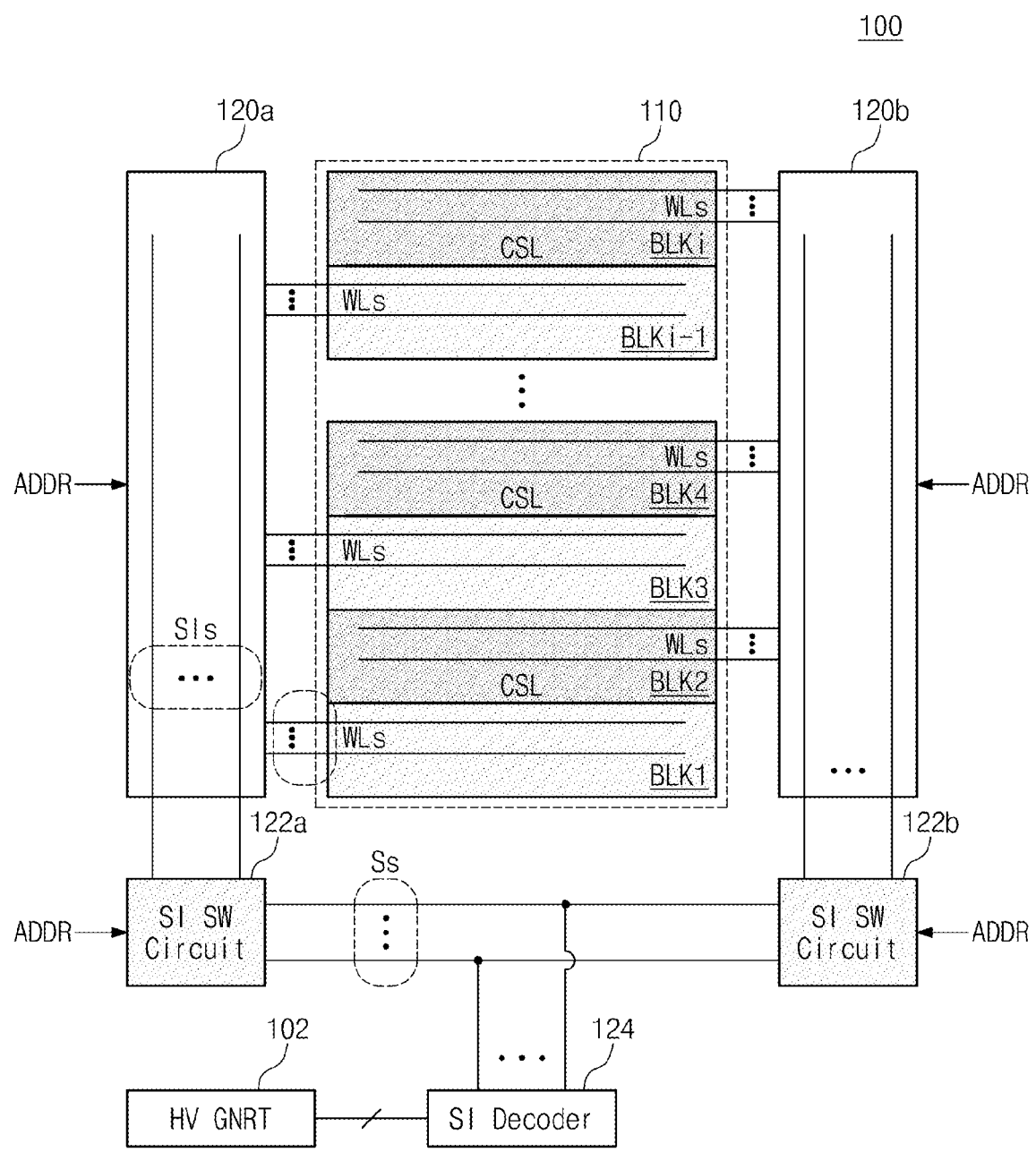
FIG. 1 is a block diagram illustrating a nonvolatile memory device according to an embodiment of the inventive concept.

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various features, but the described features should not be limited by these terms. Rather, these terms are only used to distinguish one features from another. Thus, a first element, component, region, layer, or section discussed below could be termed a second element, component, region, layer or section without changing the meaning of the relevant teachings.

Spatially relative terms, such as "beneath", "below", "lower", "under", "above", "upper" and the like, may be used herein for ease of description to describe one feature's relationship to another feature as illustrated in the drawings. The spatially relative terms are intended to encompass different orientations of the device in use or operation in addition to the orientation depicted in the drawings. For example, if the device in the drawings is turned over, features described as "below" or "beneath" or "under" other features would then be oriented "above" the other features. Thus, the example terms "below" and "under" can encompass both an orientation of above and below. The device may be otherwise oriented (rotated 90 degrees or at other orientations) and the spatially relative descriptors used herein interpreted accordingly. In addition, where a layer is referred to as being "between" two layers, it can be the only layer between the two layers, or one or more intervening layers may also be present.

The terminology used herein is for the purpose of describing certain embodiments and is not intended to be limiting of the inventive concept. As used herein, the singular forms "a", "an" and "the" are intended to include the plural forms as well, unless the context clearly indicates otherwise. Terms such as "comprises," "comprising," "includes," "including," etc., where used herein, indicate the presence of stated features but do not preclude the presence or addition of one or more other features. As used herein, the term "and/or" includes any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or this description and should not be interpreted in an idealized or overly formal sense unless expressly so defined herein.

In certain embodiments of the inventive concept, a nonvolatile memory device comprises source interface lines that allow wordlines to be connected to different voltages according to corresponding addresses. This increases the number of degrees of freedom of the voltage on each wordline. The nonvolatile memory device may be a NAND flash memory, a vertical NAND flash memory (VNAND), a NOR flash memory, a resistive RAM (RRAM), a phase-change RAM (PRAM), a magnetoresistive RAM (MRAM), or a Spin Transfer Torque Random Access Memory (STT-RAM), for example. In some embodiments, the nonvolatile memory device can be implemented with a three-dimensional array structure. Certain embodiments of the inventive concept can be applied to flash memory device where a charge storage layer is formed of a floating gate, and also to charge trap flash (CTF) memory where a charge storage layer is formed of an insulation film. In the description that follows, it is assumed that a nonvolatile memory device is a NAND flash memory device.

FIG. 1 is a block diagram illustrating a nonvolatile memory device 100 according to an embodiment of the inventive concept.

Referring to FIG. 1, nonvolatile memory device 100 comprises a high voltage generator 102, a memory cell array 110, first and second address decoders 120a and 120b, first and second source interface (SI) line switch circuits 122a and 122b, and an SI decoder 124.

High voltage generator 102 generates wordline voltages (e.g., a program voltage, a pass voltage, a read voltage, a read pass voltage, an erase voltage, etc.) for driving nonvolatile memory device 100.

Memory cell array 110 comprises multiple memory blocks BLK1 to BLKi (i>1). As illustrated in FIG. 1, a pair of adjacent memory blocks (e.g., BLK1 and BLK2) shares a common source line CSL. Each of memory blocks BLK1 to BLKi comprises multiple memory cells (not shown) connected to wordlines.

Each of first and second address decoders 120a and 120b electrically connects wordlines of a memory block selected by an address ADDR with source interface (SI) lines, or, first lines. In other words, each of first and second address decoders 120a and 120b may activate wordlines of a memory block selected by an address ADDR.

First address decoder 120a activates wordlines of each of odd-numbered memory blocks BLK1, BLK3, . . . , BLKi−1, and second address decoder 120b activates wordlines of each of even-numbered memory blocks BLK2, BLK4, . . . , BLKi. A method of selecting a memory block through first and second address decoders 120a and 120b is not limited to the illustrated examples.

Each of first and second source interface line selection switch circuits 122a and 122b electrically connects source lines Ss for providing wordline voltages with source interface lines SIs of each of first and second address decoders 120a and 120b. In particular, each of first and second source interface line selection switch circuits 122a and 122b electrically connects source lines Ss with the SI lines SIs of each of first and second address decoders 120a and 120b in different manners according to an address ADDR.

SI decoder 124 provides wordline voltages generated from high voltage generator 102 to corresponding source lines Ss according to an operation mode (e.g., a program operation, an erase operation, a read operation, etc.) and address ADDR.

Nonvolatile memory device 100 increases the degree of freedom on the SI lines SIs by connecting the SI lines SIs to source lines Ss in different manners according to address ADDR. As the degree of freedom on the SI lines SIs is increased, a layout area of nonvolatile memory device 100 is reduced as compared with that of a conventional nonvolatile memory device.

Figure 2:
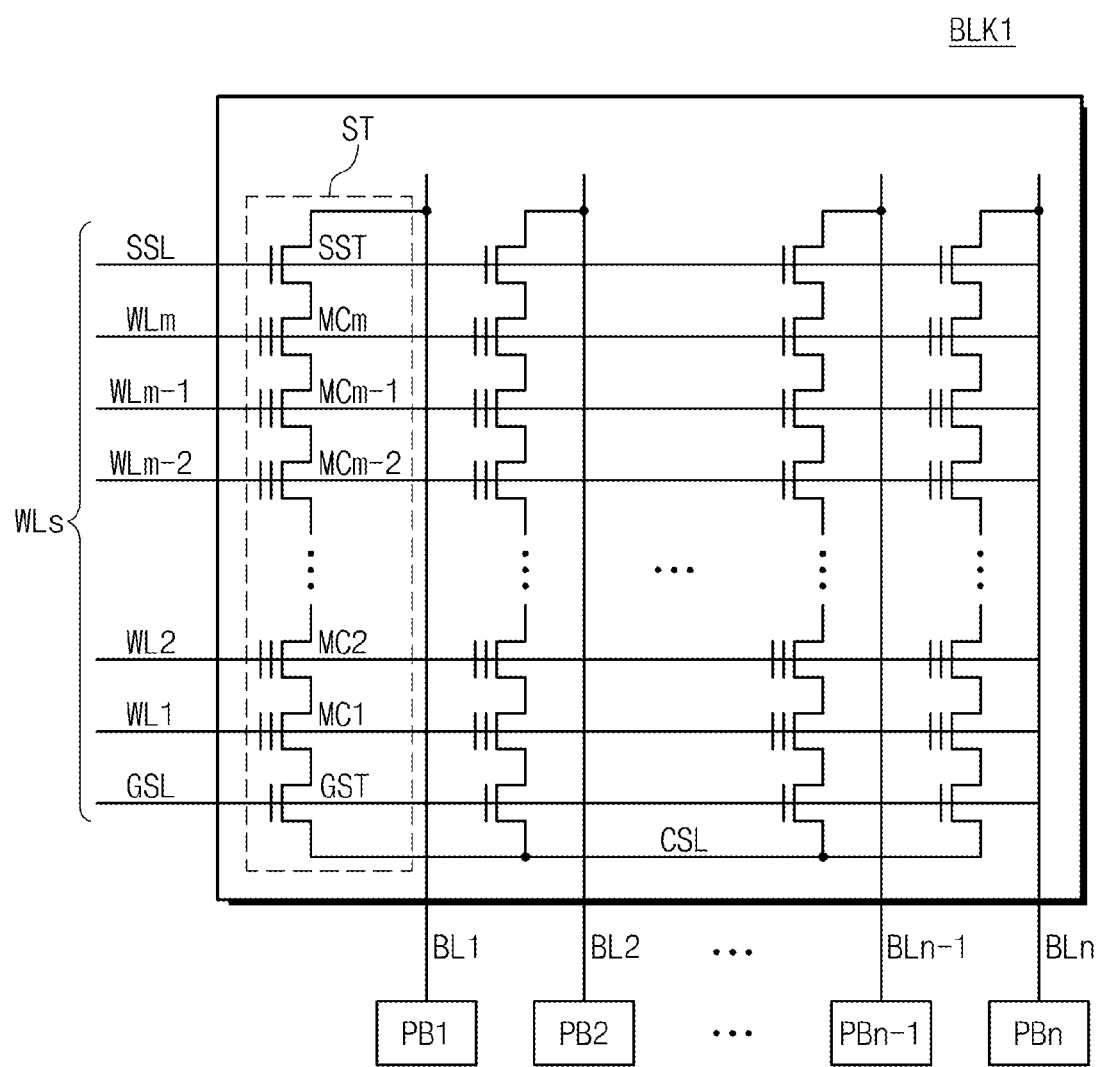
FIG. 2 is a diagram illustrating a memory block shown in FIG. 1, according to an embodiment of the inventive concept.

FIG. 2 is a diagram illustrating a memory block BLK1 shown in FIG. 1, according to an embodiment of the inventive concept.

Referring to FIG. 2, memory block BLK1 comprises multiple memory cells disposed between wordlines WL1 to WLm (m>1) and bitlines BL1 to BLn (n>1). Also, memory block BLK1 comprises strings ST respectively connected to bitlines BL1 to BLn. Each string ST comprises at least one string selection transistor SST, multiple memory cells MC1 to MCm, and at least one ground selection transistor GST connected in series between a bitline and a common source line CSL. Each memory cell stores at least one bit of data. In some embodiments, wordlines WLs comprise wordlines WL1 to WLm connected to the memory cells MC1 to MCm, a string selection line SSL connected to the string selection transistor SST, and a ground selection line GSL connected to the ground selection transistor GST. Meanwhile, as illustrated in FIG. 2, bitlines BL1 to BLn are connected to page buffers PB1 to PBn for inputting and outputting data, respectively.

Figure 3:
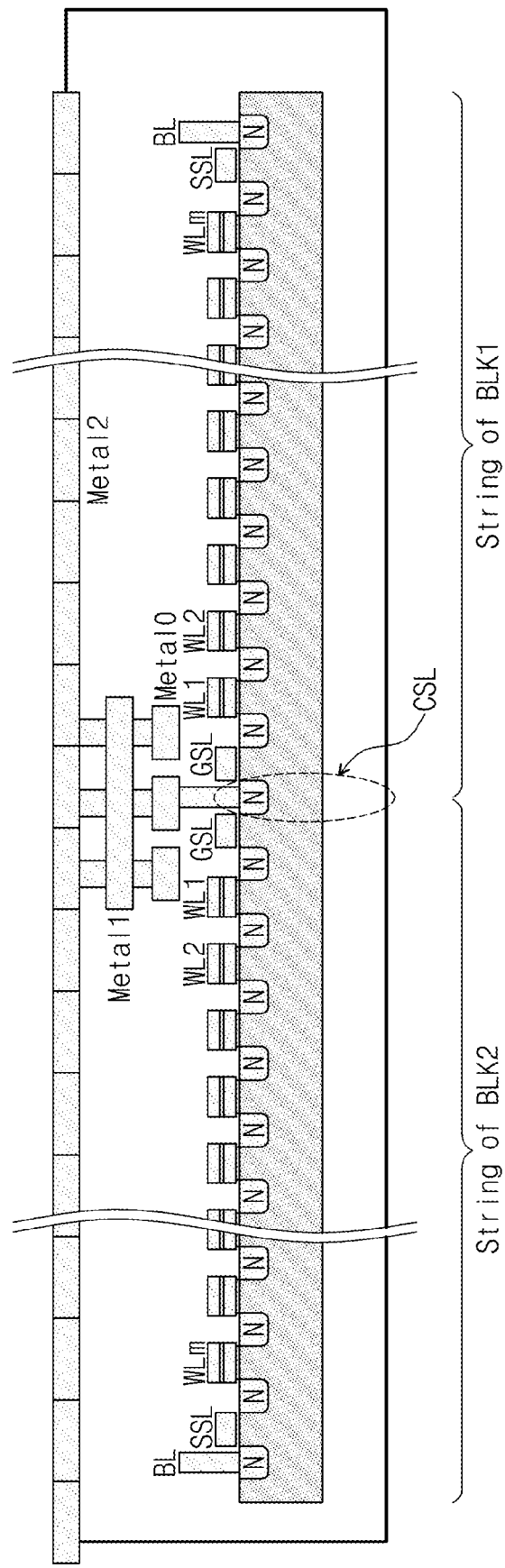
FIG. 3 is a diagram illustrating strings sharing a common source line, according to an embodiment of the inventive concept.

FIG. 3 is a diagram illustrating strings sharing a common source line. More specifically, FIG. 3 shows a string of a first memory block BLK1 and a string of a second memory block BLK2 that share a common source line CSL. In some embodiments, all memory blocks in the same mat share a common source line CSL. In the example shown in FIG. 3 common source line CSL is connected to adjacent memory blocks. However, common source line CSL may be connected to other memory blocks in the same mat through metal lines Metal0, Metal1 and Metal2.

Figure 4:
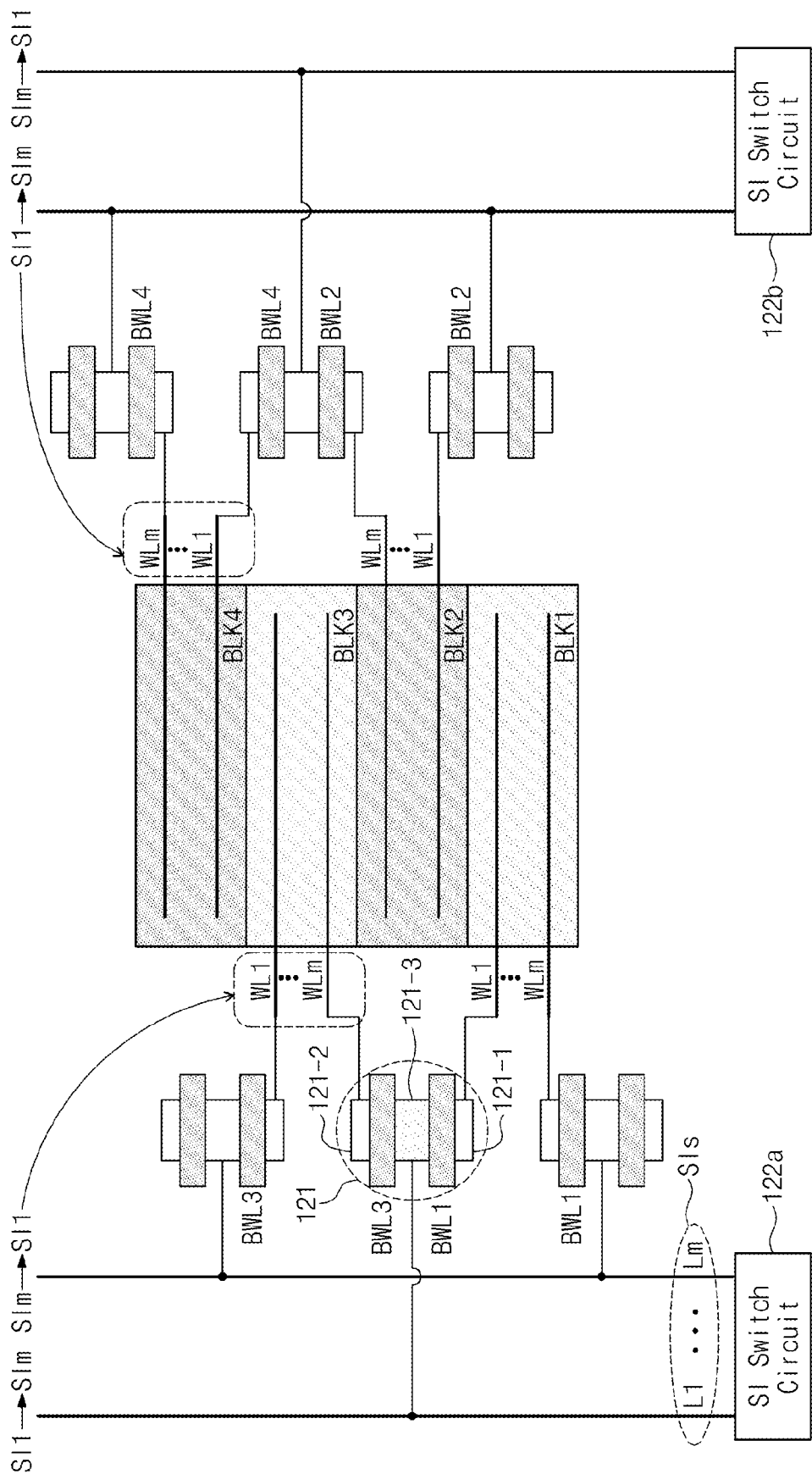
FIG. 4 is a diagram illustrating address decoders shown in FIG. 1, according to an embodiment of the inventive concept.

FIG. 4 is a diagram illustrating address decoders 120a and 120b shown in FIG. 1, according to an embodiment of the inventive concept.

Referring to FIG. 4, each of first and second address decoders 120a and 120b comprises multiple lines L1 to Lm and multiple block selection transistors 121 (also referred to as "pass transistors").

SI line selection switch circuits 122a and 122b use lines L1 to Lm as multiple SI lines SIs. In some embodiments, lines L1 to Lm may be used as different SI lines SIs by SI line selection switch circuits 122a and 122b. For example, lines L1 to Lm may be used as SI lines SI1 to SIm in a forward order. Alternatively, lines L1 to Lm may be used as SI lines SIm to SI1 in reverse order.

Each of lines L1 to Lm is connected to source regions (e.g., 121-3) of at least two block selection transistors. Here, at least one drain region (e.g., 121-1 and 121-2) of each of at least two block selection transistors is connected to a wordline of any memory block. For example, a first drain region 121-1 is connected to a wordline WL1 of a first memory block BLK1, and a second drain region 121-2 is connected to a wordline WLm of a third memory block BLK3.

In some embodiments, at least two block selection transistors share a source region 121-3. For example, at least two block selection transistors 121 comprise a first block selection transistor and a second block selection transistor. The first block selection transistor has a gate region connected to a first block selection wordline BWL1, a drain region 121-1 connected to a first wordline WL1 of first memory block BLK1, and a source region 121-3. The second block selection transistor has a gate region connected to a second block selection wordline BWL3 different from the first block selection wordline BWL1, a drain region 121-2 connected to a second wordline WLm of a second memory block BLK3 different from first memory block BLK1, and a source region 121-3. Here, source region 121-3 of first block selection transistor and source region 121-3 of the second block selection transistor are shared.

Although FIG. 4, shows an embodiment where a source region 121-3 is associated with a first wordline WL1 connected to the first block selection transistor and a second wordline WLm connected to the second block selection transistor, the inventive concept is not limited thereto. For instance, in alternative embodiments shared source region 121-3 may be associated with any wordline of memory block BLK1 and any wordline of the memory block BLK3.

In some embodiments, a high voltage is applied to a memory block selection wordline corresponding to a memory block selected by an address ADDR (refer to FIG. 1). In some embodiments, where an address ADDR is received for selecting first memory block BLK1, lines L1 to Lm are used as SI lines SI1 to SIm in forward order and a high voltage is applied to the first memory block selection wordline BWL1. In some other embodiments, where an address ADDR is received for selecting third memory block BLK3, lines L1 to Lm are used as SI lines SIm to SI1 in reverse order and a high voltage is applied to third memory block selection wordline BWL3.

An address decoder 120a/120b may use lines L1 to Lm as different SI lines SIs according to an address. That is, the degrees of freedom on the SI lines SIs may be increased.

In certain conventional address decoders, a source sharing structure of block selection transistors is fixed to SI lines SIs. In such address decoders, a twisted portion occurs when connecting wordlines and block selection transistors to a peripheral area (a left side area or a right side area) between adjacent memory blocks. This prevents an address decoder (or an interface circuit) from being disposed at a peripheral area between two adjacent memory blocks.

In contrast, address decoder 120a/120b comprises SI lines SIs changeable according to an address. Thus, a twisted portion does not occur when connecting wordlines and block selection transistors to a peripheral area between two memory blocks adjacent to each other. That is, an address decoder (or, an interface circuit) is disposed at a peripheral area between two memory blocks adjacent to each other. Also, a layout size is reduced by disposing an address decoder (or, an interface circuit) at a peripheral area between two memory blocks adjacent to each other.

Figure 5:
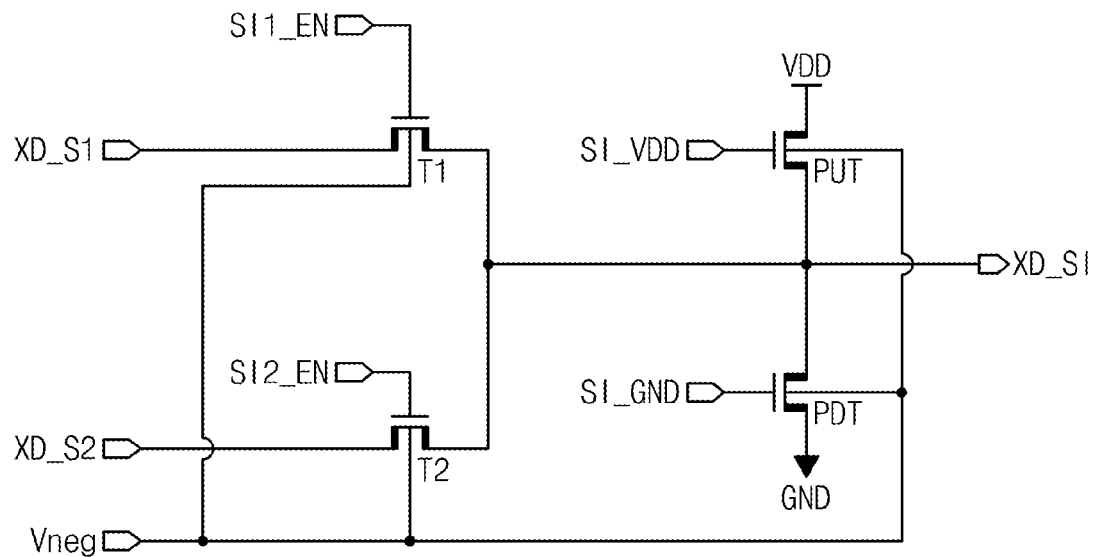
FIG. 5 is a diagram illustrating a line selection switch of source interface (SI) line selection switch circuits shown in FIG. 1, according to an embodiment of the inventive concept.

FIG. 5 is a diagram illustrating a line selection switch 122*i* of SI line selection switch circuits 122*a* and 122*b* shown in FIG. 1, according to an embodiment of the inventive concept.

Referring to FIG. 5, a line selection switch 122*i* comprises first and second transistors T1 and T2, a pull-up transistor PUT, and a pull-down transistor PDT. Line selection switch 122*i* connects one of a first input terminal XD_S1 and a second input terminal XD_S2 to an output terminal XD_SI in response to line enable signals SI1_EN and SI2_EN. First input terminal XD_S1 is connected to one of multiple source lines Ss (refer to FIG. 1). Second input terminal XD_S2 is connected to one of source lines ss. A source line connected to first input terminal XD_S1 is different from a source line connected to second input terminal XD_S2.

First transistor T1 is connected between first input terminal XD_S1 and output terminal XD_SI and has a gate connected to receive first line enable signal SI1_EN. First transistor T1 connects first input terminal XD_S1 to output terminal XD_SI in response to first line enable signal SI1_EN. Second transistor T2 is connected between second input terminal XD_S2 and output terminal XD_SI and has a gate connected to receive second line enable signal SI2_EN. Second transistor T2 connects second input terminal XD_S2 to output terminal XD_SI in response to second line enable signal SI2_EN.

In some embodiments, first and second enable signals SI1_EN and SI2_EN are generated using an address ADDR. In some embodiments, each of the first and second transistors T1 and T2 is a high voltage transistor.

Pull-up transistor PUT is connected between a power supply voltage VDD and output terminal XD_SI and has a gate connected to receive a power applying signal SI_VDD. Pull-up transistor PUT applies power supply voltage VDD to output terminal XD_SI in response to power applying signal SI_VDD. In some embodiments, pull-up transistor PUT supplies power supply voltage VDD to SI lines SIs in an erase operation. Thus, it is possible to prevent an unselected memory block from being erased.

Pull-down transistor PDT connects output terminal XD_SI to a ground voltage GND in response to a ground voltage applying signal SI_GND. Pull-down transistor PDT is connected between ground voltage GND and output terminal XD_SI and has a gate connected to receive ground voltage applying signal SI_GND. Pull-down transistor PDT discharges voltages of the SI lines SIs.

In some embodiments, each of pull-up transistor PUT and pull-down transistor PDT is a high voltage transistor. In some embodiments, bodies of the transistors T1, T2, PUT and PDT are connected to a negative voltage terminal Vneg.

Line selection switch 122*i* connects one of two source lines to an SI line in response to the line enable signals SI1_EN and SI2_EN.

The degrees of freedom on an SI line shown in FIG. 5 is 2, meaning that one of two source interface lines is selected. However, the inventive concept is not limited thereto. For example, the degrees of freedom on an SI line may be 3 or more.

Figure 6:
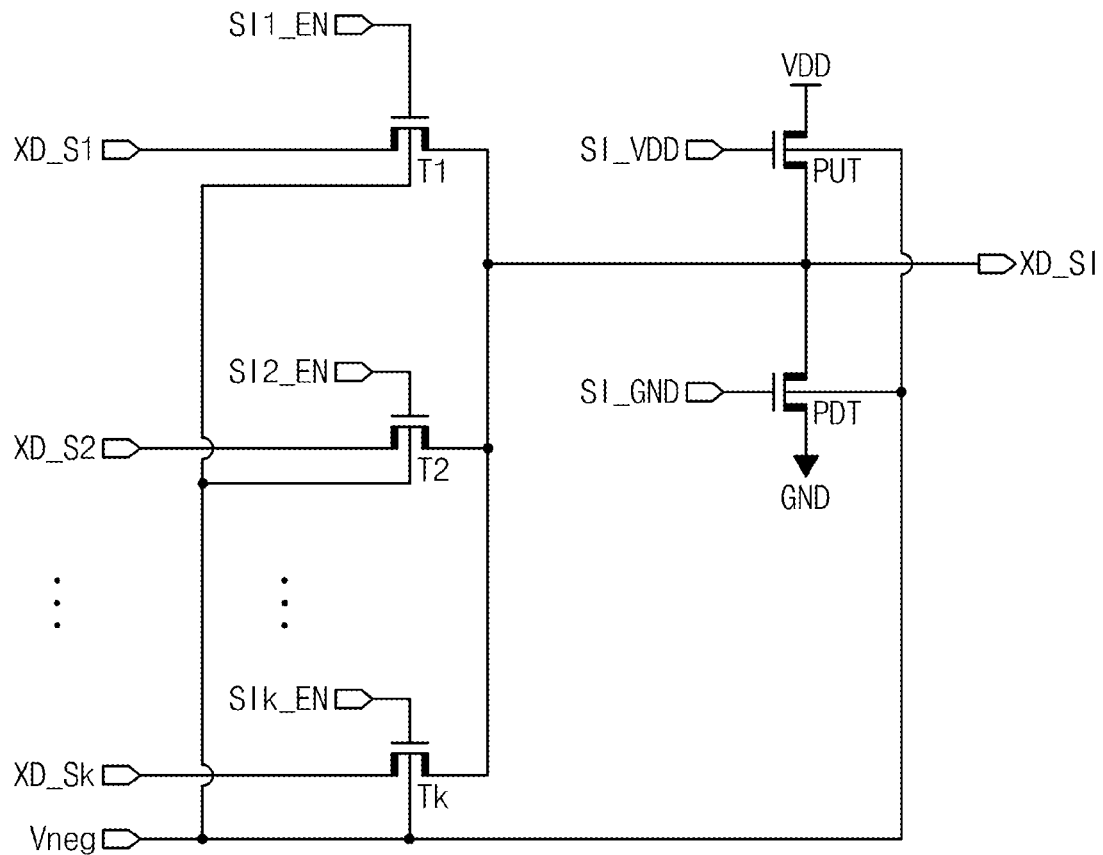
FIG. 6 is a diagram illustrating a line selection switch of SI line selection switch circuits shown in FIG. 1, according to another embodiment of the inventive concept.

FIG. 6 is a diagram illustrating a line selection switch 122*ia* of SI line selection switch circuits 122*a* and 122*b* shown in FIG. 1, according to another embodiment of the inventive concept.

Referring to FIG. 6, a line selection switch 122*ia* comprises multiple transistors T1 to Tk, a pull-up transistor PUT and a pull-down transistor PDT. Compared with a line selection switch 122*i* shown in FIG. 5, line selection switch 122*ia* shown in FIG. 6 further comprises at least one transistor Tk connecting an input terminal XD_Sk and an output terminal XD_SI. Transistor Tk is connected between a kth input terminal XD_Sk and output terminal XD_SI and has a gate connected to receive a line enable signal SIk_EN. Transistor Tk connects the kth input terminal XD_Sk to output terminal XD_SI in response to the line enable signal SIk_EN.

Line selection switch 122*ia* according to an embodiment of the inventive concept connects one of k source lines to one SI line in response to line enable signals SI1_EN to SIk_EN.

In FIGS. 1 to 6, source lines Ss and SI lines SIs are connected in different manners to increase the degree of freedom. However, the inventive concept is not limited thereto. For example, source lines Ss and an SI decoder may be connected in different manners to increase the degrees of freedom.

Figure 7:
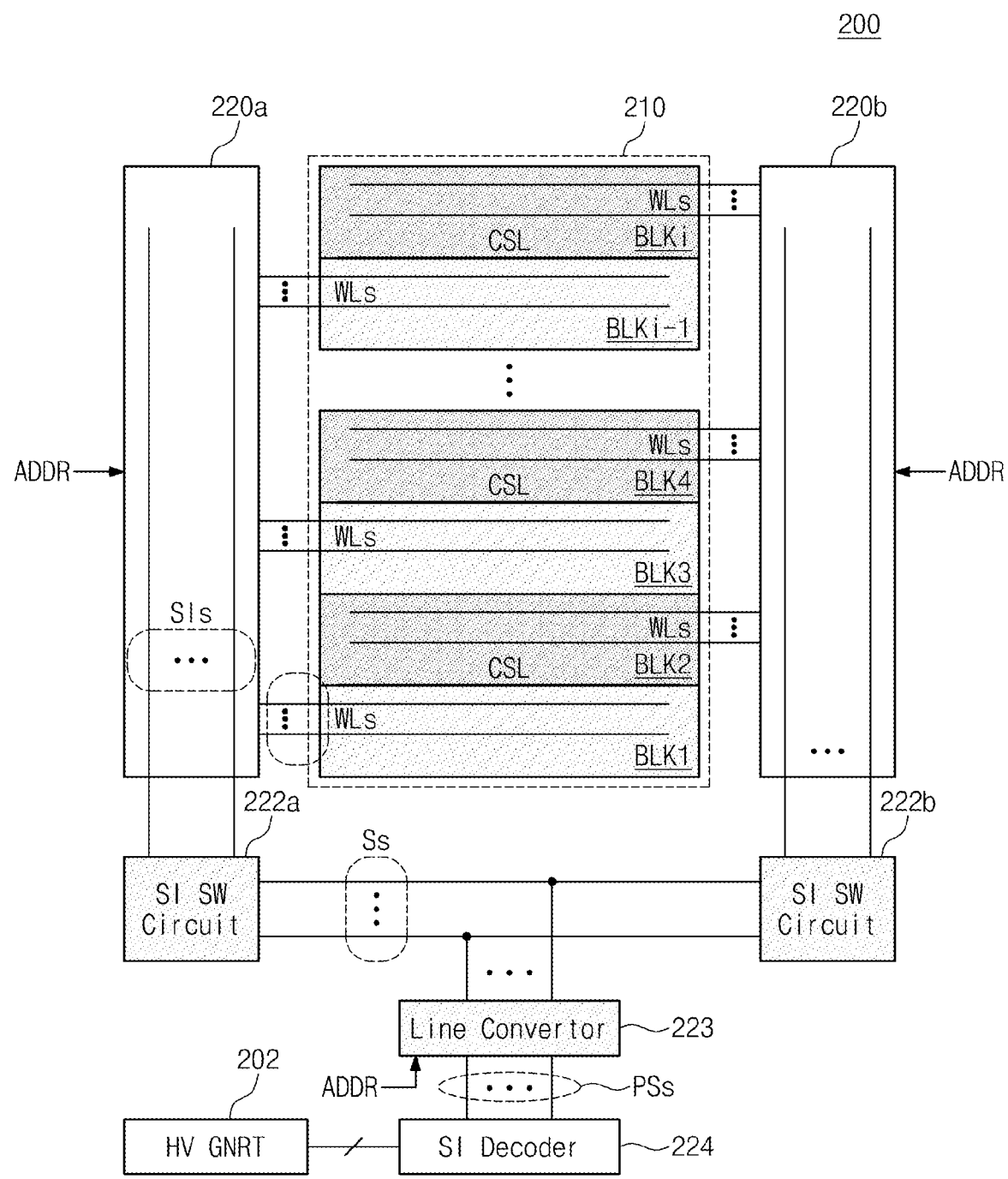
FIG. 7 is a block diagram illustrating a nonvolatile memory device according to another embodiment of the inventive concept.

FIG. 7 is a block diagram illustrating a nonvolatile memory device according to another embodiment of the inventive concept.

Referring to FIG. 7, a nonvolatile memory device 200 comprises a high voltage generator 202, a memory cell array 210, first and second address decoders 220*a* and 220*b*, first and second source interface (SI) line switch circuits 222*a* and 222*b*, a line convertor 223, and an SI decoder 224.

High voltage generator 202, memory cell array 210, and first and second address decoders 220*a* and 220*b* can be implemented substantially the same as those shown in FIG. 1.

Each of the first and second SI line switch circuits 222*a* and 222*b* connects source lines Ss to SI lines SIs.

Line converter 223 connects pre-source lines PSs to source lines Ss in different manners according to an address ADDR.

SI decoder 224 transfers wordline voltage for driving to the pre-source lines PSs.

Nonvolatile memory device 200 changes locations of wordline voltages transferred through source lines Ss in response to address ADDR.

Figure 8:
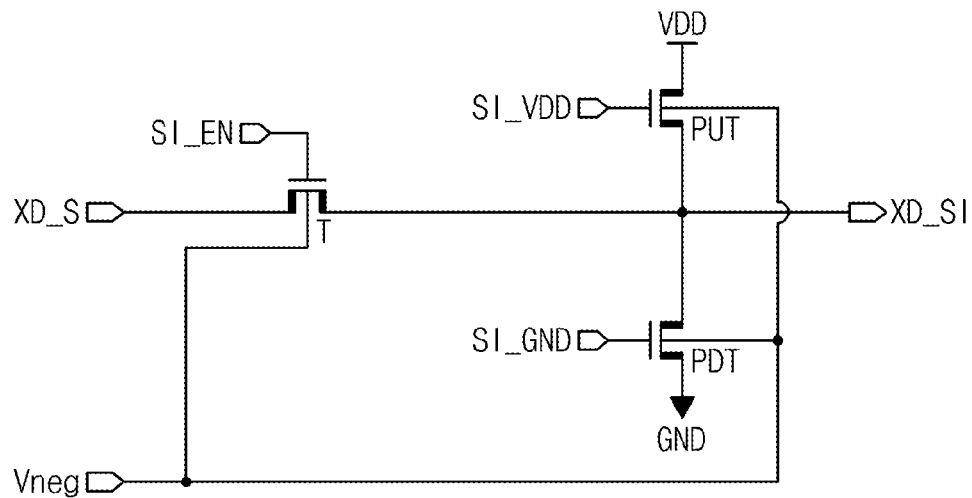
FIG. 8 is a diagram illustrating a line selection switch of SI line selection switch circuits shown in FIG. 7, according to an embodiment of the inventive concept.

FIG. 8 is a diagram illustrating a line selection switch 222*i* of SI line selection switch circuits 222*a* and 222*b* shown in FIG. 7, according to an embodiment of the inventive concept.

Referring to FIG. 8, a line selection switch 222*i* comprises a transistor T, a pull-up transistor PUT, and a pull-down transistor PDT.

Line selection switch 222*i* connects an input terminal XD_S to an output terminal XD_SI in response to a line enable signal SI_EN. Input terminal XD_S1 is connected to one of multiple source lines Ss (refer to FIG. 1).

Transistor T is connected between input terminal XD_S and output terminal XD_SI and has a gate connected to receive the line enable signal SI_EN. Transistor T connects input terminal XD_S to output terminal XD_SI in response to the line enable signal SI_EN.

Pull-up and pull-down transistors PUT and PDT are configured substantially the same as those shown in FIG. 5.

Line selection switch 222*i* connects one of source lines Ss to one of SI lines SIs in response to the line enable signal SI_EN.

Figure 9:
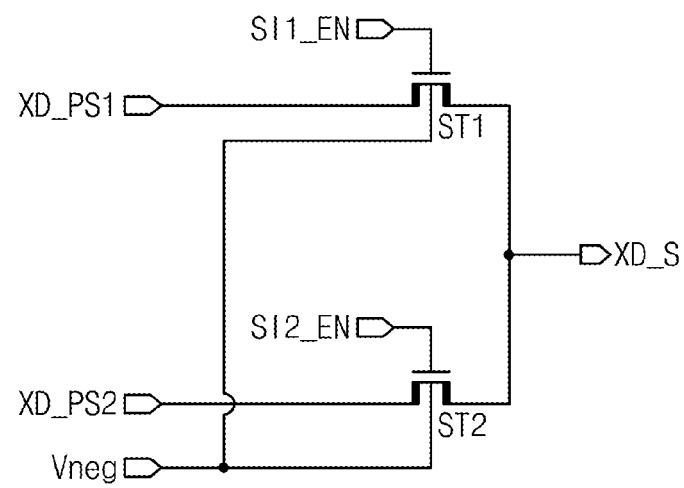
FIG. 9 is a diagram illustrating a line conversion switch of a line convertor shown in FIG. 7, according to an embodiment of the inventive concept.

FIG. 9 is a diagram illustrating a line conversion switch 223*i* of a line convertor 223 shown in FIG. 7, according to an embodiment of the inventive concept.

Referring to FIG. 9, a line conversion switch 223*i* comprises first and second source transistors ST1 and ST2.

First source transistor ST1 connects a first pre-source terminal XD_PS1 to a source terminal XD_S in response to a first line enable signal SI1_EN. Here, first pre-source terminal XD_PS1 may be connected to one of pre-source lines PSs. Source terminal XD_S may be connected to one of source lines Ss.

Second source transistor ST2 connects a second pre-source terminal XD_PS2 to source terminal XD_S in response to a second line enable signal SI2_EN. Here, second pre-source terminal XD_PS2 may be connected to one of the pre-source lines PSs. The pre-source line thus connected to the second pre-source terminal XD_PS2 is different from a pre-source line connected to first pre-source terminal XD_PS1.

In some embodiments, each of the first and second source transistors ST1 and ST2 is a high voltage transistor.

In some embodiments, bodies of the first and second source transistors ST1 and ST2 is connected to a negative voltage terminal Vneg.

In some embodiments, first and second line enable signals SI1_EN and SI2_EN are generated using an address ADDR (refer to FIG. 7).

Line conversion switch 223*i* connects a pre-source line and a source line in different manners, based on the first and second line enable signals SI1_EN and SI2_EN generated using an address ADDR.

In line conversion switch 223*i* shown in FIG. 7, the number of degrees of freedom on line is 2, but the inventive concept is not limited thereto. For example, the degrees of freedom in the line conversion switch 223*i* could be 3 or more.

In the examples illustrated in FIGS. 1 to 6, a structure increases the degrees of freedom of SI lines according to an address ADDR. In the examples of FIGS. 7 to 9, a structure increases the degrees of freedom of source lines according to an address ADDR. In alternative embodiments, analogous structures could be used to increase the degrees of freedom on wordline voltages applied to source lines.

Figure 10:
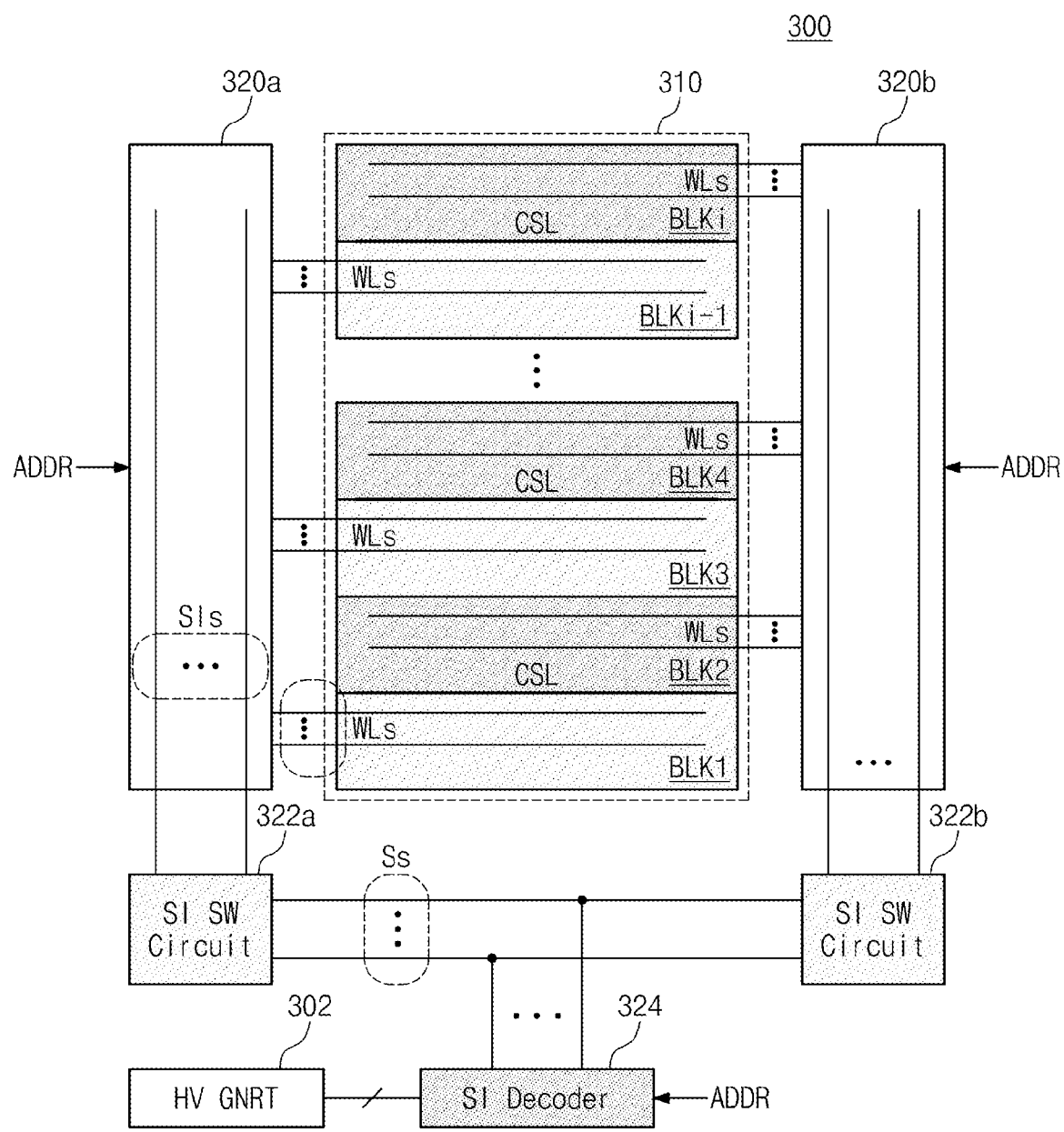
FIG. 10 is a block diagram illustrating a nonvolatile memory device according to still another embodiment of the inventive concept.

FIG. 10 is a block diagram illustrating a nonvolatile memory device according to still another embodiment of the inventive concept.

Referring to FIG. 10, a nonvolatile memory device 300 comprises a high voltage generator 302, a memory cell array 310, first and second address decoders 320*a* and 320*b*, first and second source interface (SI) line switch circuits 322*a* and 322*b*, and an SI decoder 324.

High voltage generator 302, memory cell array 310, first and second address decoders 320*a* and 320*b*, first and second source interface (SI) line switch circuits 322*a* and 322*b*, and SI decoder 324 are configured substantially the same as those shown in FIG. 7.

SI decoder 324 applies wordline voltages needed for driving to source lines Ss in different manners according to an address ADDR.

Nonvolatile memory device 300 transfers wordline voltages to source lines Ss in different manners according to an address ADDR. That is, the number of degrees of freedom of wordline voltages applied to source lines Ss is increased.

Figure 11:
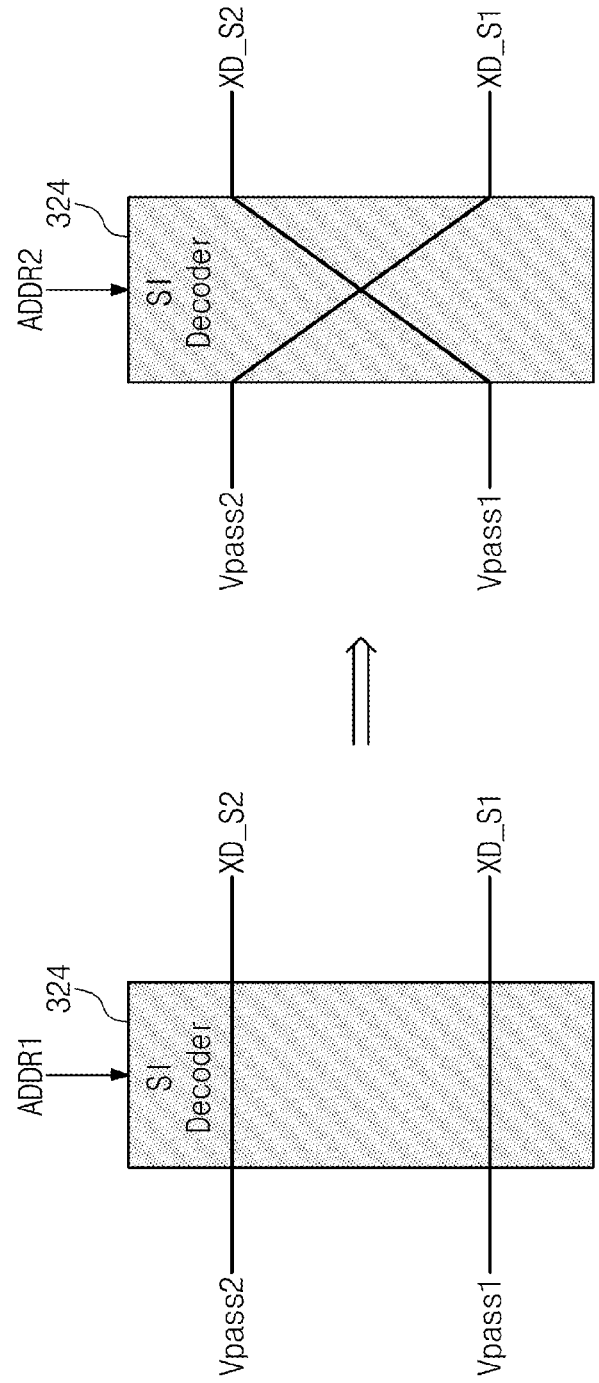
FIG. 11 is a diagram for describing a wordline voltage applying manner of an SI decoder shown in FIG. 10, according to an embodiment of the inventive concept.

FIG. 11 is a diagram for describing a wordline voltage applying manner of an SI decoder 324 shown in FIG. 10.

Referring to FIG. 11, an SI decoder 324 applies a first pass voltage Vpass1 and a second pass voltage Vpass2 to a first source line terminal XD_S1 and a second source line terminal XD_S2 in response to an address ADDR1 (e.g., an even-numbered address), respectively.

Also, SI decoder 324 applies first pass voltage Vpass1 and second pass voltage Vpass2 to second source line terminal XD_S2 and first source line terminal XD_S1 in response to an address ADDR2 (e.g., an odd-numbered address), respectively. Here, address ADDR2 may be different from address ADDR1.

SI decoder 324 transfers a wordline voltage Vpass1/Vpass2 to a source line in different manners according to an address ADDR1/ADDR2.

Figure 12:
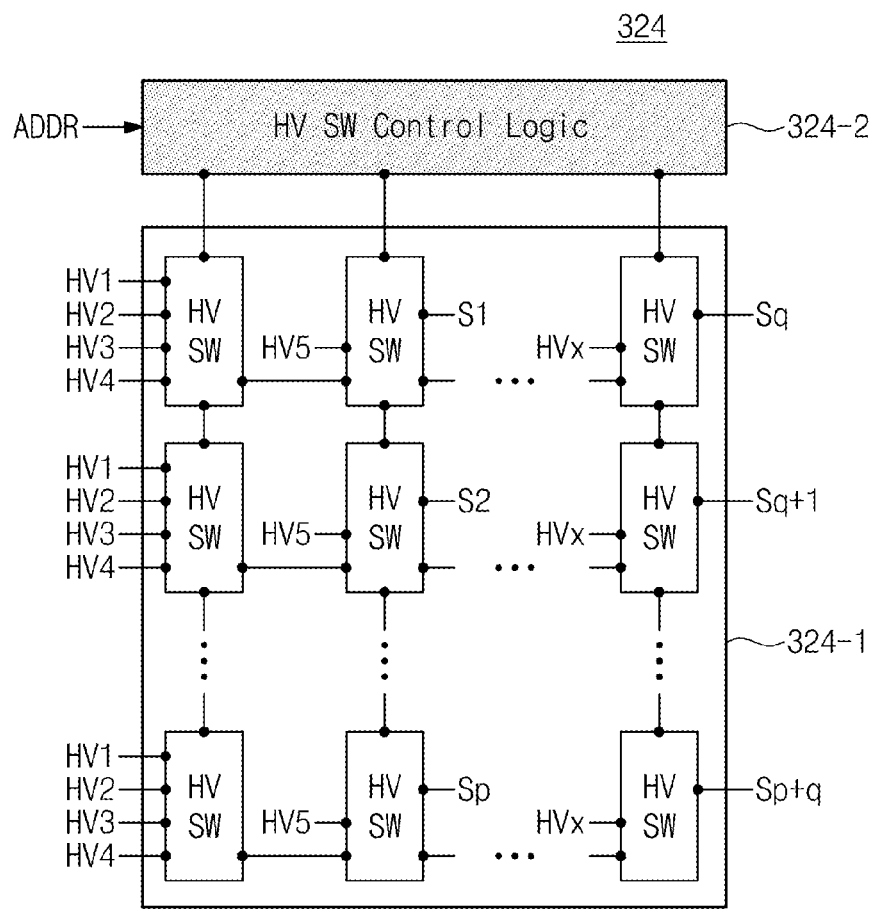
FIG. 12 is a diagram illustrating an SI decoder shown in FIG. 10, according to an embodiment of the inventive concept.

FIG. 12 is a diagram illustrating an SI decoder 324 shown in FIG. 10, according to an embodiment of the inventive concept.

Referring to FIG. 12, an SI decoder 324 comprises high voltage switches 324-1 and a high voltage switch control circuit 324-2.

Each of high voltage switches 324-1 is provided with at least one of voltage sources HV1, HV2, HV3, HV4, HV5, HVx, etc. In some embodiments, some of high voltage switches may be connected one of source lines S1 to Sp+q.

High voltage switch control circuit 324-2 controls respective high voltage switches HV SW according to an operation mode (e.g., a program operation, a read operation, an erase operation, etc.) of a nonvolatile memory device 300 such that source voltages HV1, HV2, HV3, and HV4 are provided to wordlines.

In some embodiments, high voltage switch control circuit 324-2 differently controls a high voltage switch group 324-1 according to a time interval for implementing a boosting scheme during a program mode of operation.

SI decoder 324 differently selects a high voltage to be provided to source lines according to an operation mode and an address ADDR.

Figure 13:
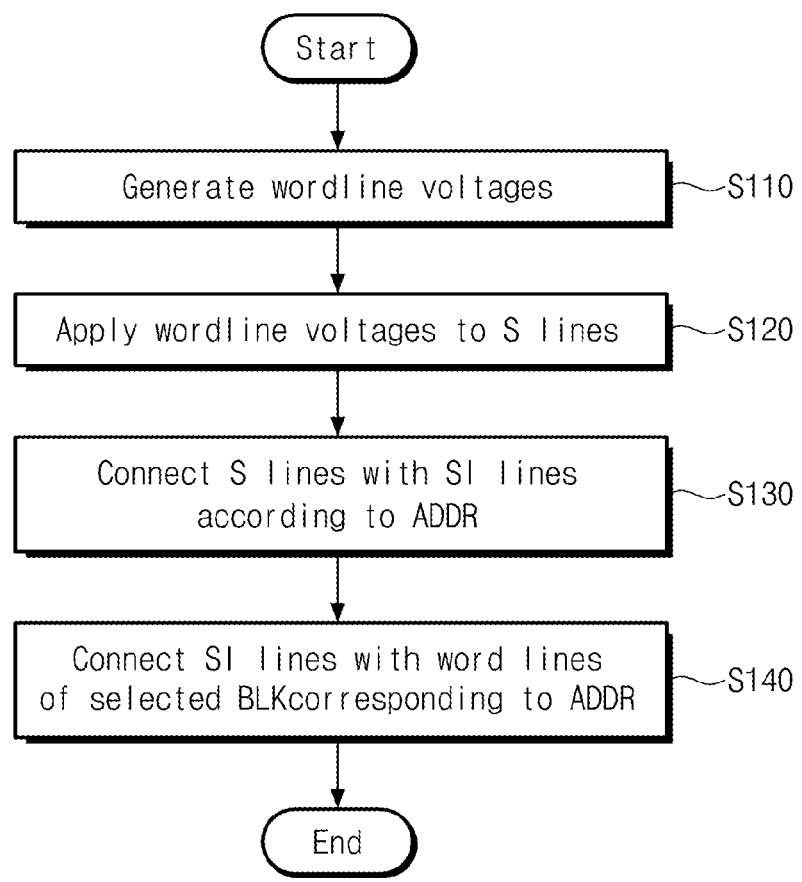
FIG. 13 is a flowchart illustrating a wordline voltage applying method according to an embodiment of the inventive concept.

FIG. 13 is a flowchart illustrating a wordline voltage applying method according to an embodiment of the inventive concept. Below, a wordline voltage applying method according to an embodiment of the inventive concept is described with reference to FIGS. 1 and 13.

In step S110, a high voltage generator 102 generates wordline voltages for driving nonvolatile memory device 100. In step S120, the wordline voltages are applied to corresponding source lines Ss (e.g., first lines) by an SI decoder 124. In step S130, each of SI line selection switch circuits 122*a* and 122*b* connects source lines Ss and SI lines SIs (e.g., second lines) in a manner determined by an address ADDR. In step S140, address decoders 120*a* and 120*b* connect source interface lines SIs to wordlines of a memory block selected by address ADDR.

A wordline voltage applying method according to an embodiment of the inventive concept applies wordline voltages in different manners according to a memory block address ADDR.

Although the above description of FIGS. 1 to 13 presents a wordline voltage applying method, the inventive concept is not limited thereto. Alternatively, for instance, the inventive concept could be applied to a method of applying a selection voltage to string and ground selection lines SSL and GSL shown in FIG. 2.

Figure 14:
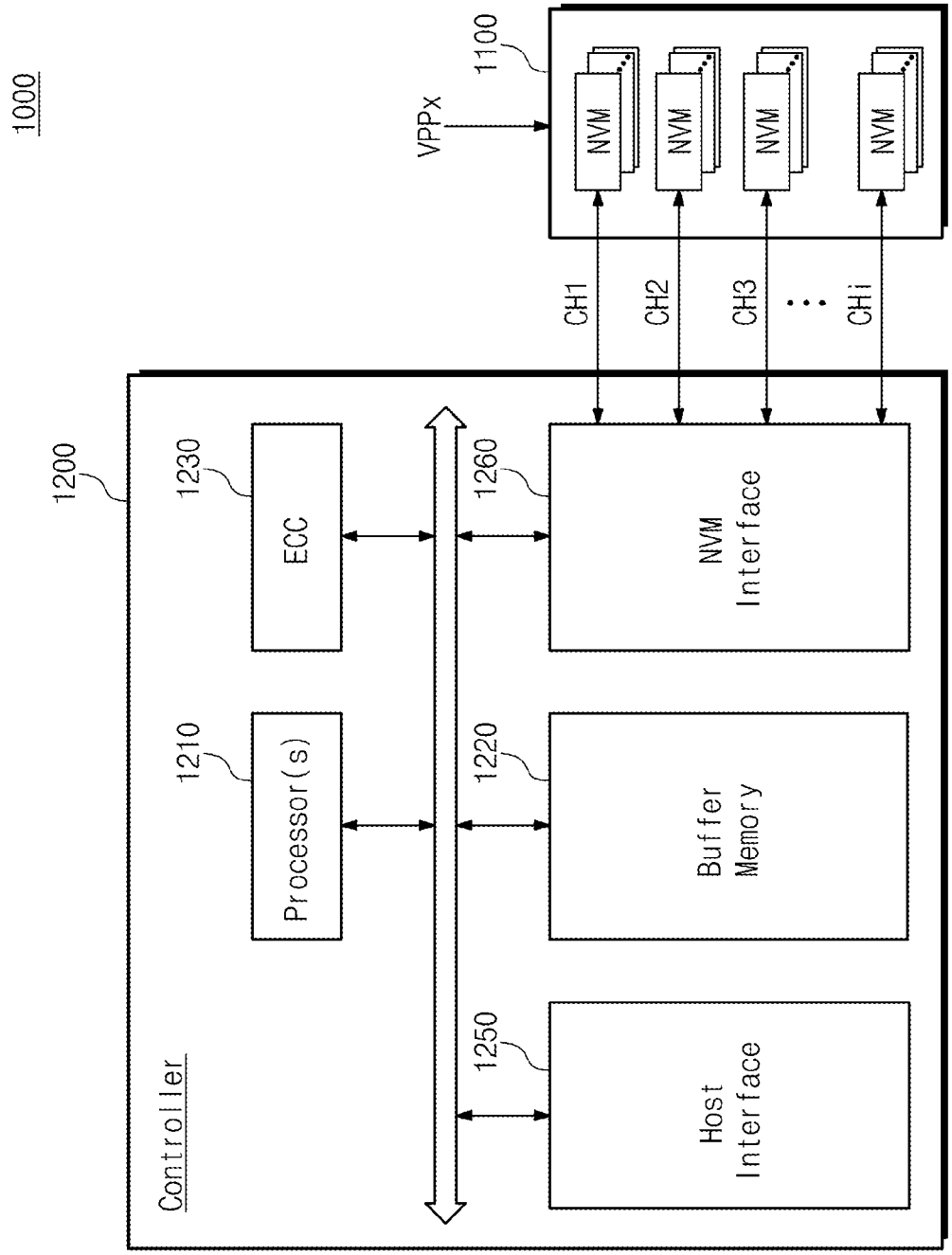
FIG. 14 is a block diagram illustrating a solid state drive (SSD), according to an embodiment of the inventive concept.

FIG. 14 is a block diagram illustrating an SSD 1000 according to an embodiment of the inventive concept.

Referring to FIG. 14, SSD 1000 comprises multiple nonvolatile memory devices 1100 and an SSD controller 1200.

Nonvolatile memory devices 1100 may be optionally supplied with an external high voltage VPPx. Each of nonvolatile memory devices 1100, as described with reference to FIGS. 1 to 13, is implemented to improve the degree of freedom on SI lines SIs and S lines Ss or the degree of freedom on wordline voltages applied to the S lines Ss according to an address ADDR.

SSD controller 1200 is connected to nonvolatile memory devices 1100 through multiple channels CH1 to CHi. SSD controller 1200 comprises one or more processors 1210, a buffer memory 1220, an ECC block 1230, a host interface 1250, and a nonvolatile memory interface 1260.

Buffer memory 1220 stores data used to drive the SSD controller 1200. Buffer memory 1220 comprises multiple memory lines each storing data or a command. Although FIG. 14 illustrate an embodiment where buffer memory 1220 is included in the SSD controller 1200, the inventive concept is not limited thereto. Alternatively, for instance, buffer memory 1220 may be placed outside SSD controller 1200.

ECC block 1230 calculates error correction code values of data to be programmed at a writing operation and corrects an error of read data using an error correction code value at a read operation. In a data recovery operation, ECC block 1230 corrects an error of data recovered from nonvolatile memory devices 1100. Although not shown in FIG. 14, a code memory may be further included to store code data needed to drive the SSD controller 1200. The code memory is implemented by a nonvolatile memory device.

Host interface 1250 provides an interface with an external device. Nonvolatile memory interface 1260 provides an interface with nonvolatile memory devices 1100.

In SSD 100 according to an embodiment of the inventive concept, a layout area is reduced by improving the degree of freedom on SI lines Ss according to an address.

Figure 15:
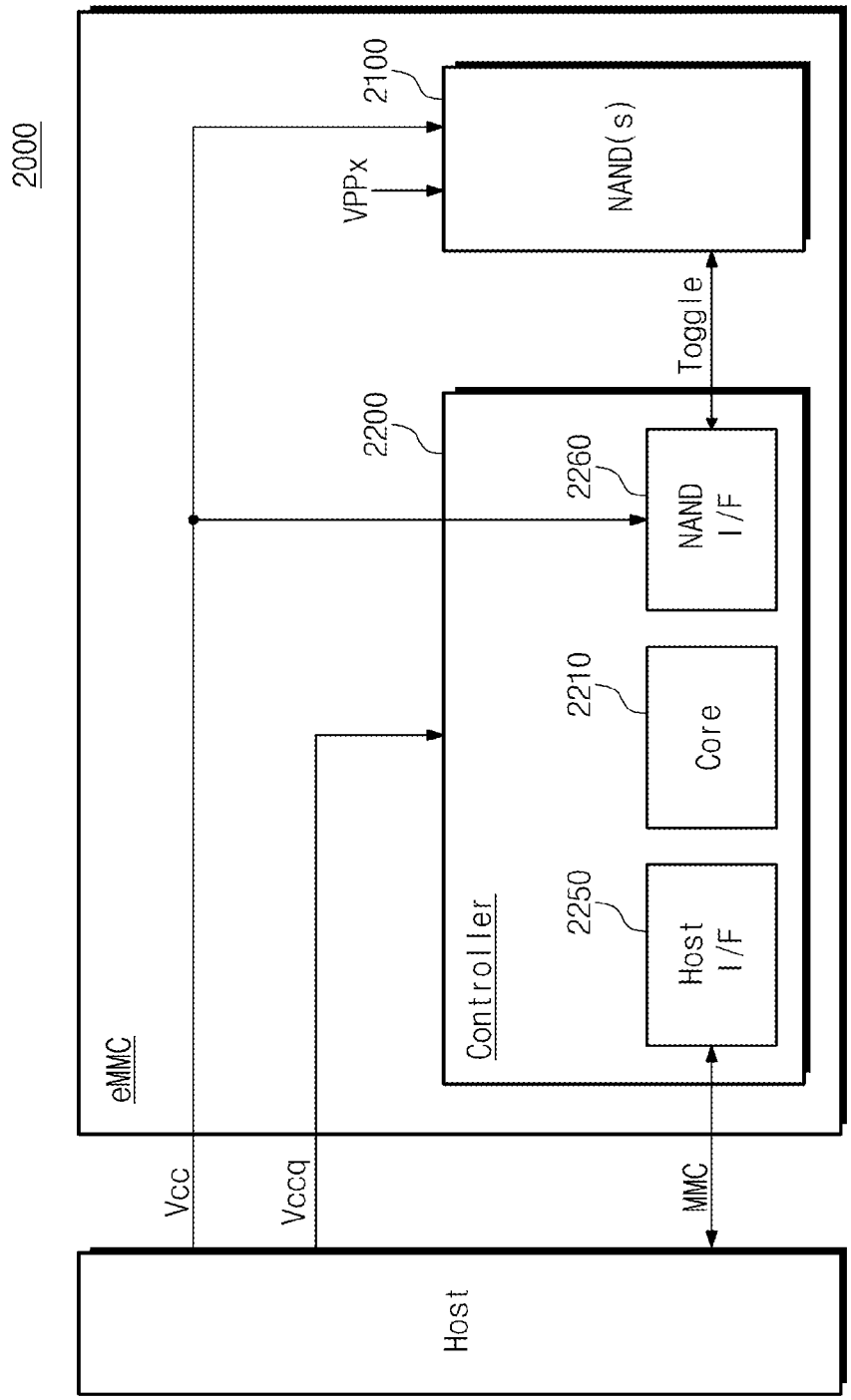
FIG. 15 is a block diagram illustrating an embedded multimedia card (eMMC) according to an embodiment of the inventive concept.

FIG. 15 is a block diagram illustrating an eMMC according to an embodiment of the inventive concept.

Referring to FIG. 15, an eMMC 2000 comprises one or more NAND flash memory devices 2100 and controller 2200.

NAND flash memory device 2100 is implemented by a nonvolatile memory device 100 shown in FIG. 1, a nonvolatile memory device 200 shown in FIG. 7 or a nonvolatile memory device 300 shown in FIG. 10.

Controller 2200 is connected with NAND flash memory device 2100 via multiple channels. Controller 2200 includes one or more controller cores 2210, a host interface 2250, and a NAND interface 2260. Controller core 2210 controls an overall operation of eMMC 2000. Host interface 2250 is configured to perform an interface between the controller 2210 and a host. NAND interface 2260 is configured to provide an interface between NAND flash memory device 2100 and controller 2200. In example embodiments, host interface 2250 may be a parallel interface (e.g., an MMC interface). In other embodiments, host interface 2250 of eMMC 2000 may be a serial interface (e.g., UHS-II, UFS, etc.).

The eMMC 2000 receives power supply voltages Vcc and Vccq from the host. Herein, power supply voltage Vcc (e.g., about 3.3V) is supplied to NAND flash memory device 2100 and NAND interface 2260, and power supply voltage Vccq (e.g., about 1.8V/3.3V) is supplied to the controller 2200. In some embodiments, eMMC 2000 may be optionally supplied with an external high voltage.

It may be beneficial to implement a small-sized and light eMMC 200 by reducing a layout area of SI lines.

Figure 16:
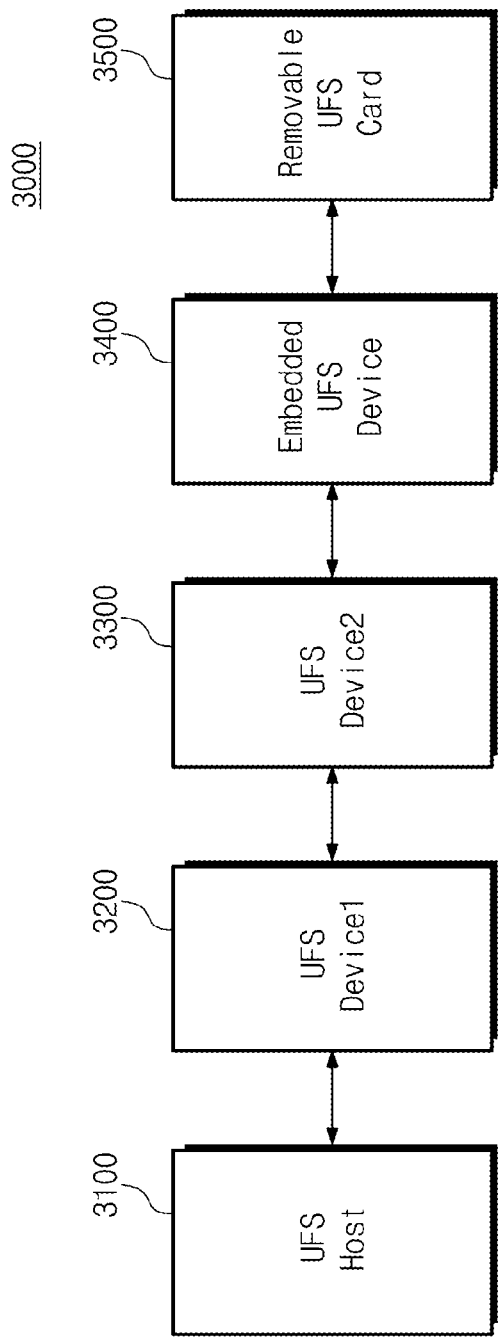
FIG. 16 is a block diagram illustrating a universal flash storage (UFS) system according to an embodiment of the inventive concept.

FIG. 16 is a block diagram illustrating a UFS system 3000 according to an embodiment of the inventive concept.

Referring to FIG. 16, UFS system 3000 comprises a UFS host 3100, UFS devices 3200 and 3300, an embedded UFS device 3400, and a removable UFS card 3500. UFS host 3100 is an application processor of a mobile device. UFS host 3100 is implemented by a host 200 shown in FIG. 1. Each of UFS host 3100, UFS devices 3200 and 3300, embedded UFS device 3400, and removable UFS card 3500 communicate with external devices through the UFS protocol. At least one of UFS devices 3200 and 3300, embedded UFS device 3400, and removable UFS card 3500 is implemented by a nonvolatile memory device 100 shown in FIG. 1, a nonvolatile memory device 200 shown in FIG. 7, or a nonvolatile memory device 300 shown in FIG. 10.

Meanwhile, embedded UFS device 3400 and removable UFS card 3500 may perform communications using protocols different from the UFS protocol. UFS host 3100 and removable UFS card 3500 may communicate through various card protocols (e.g., UFDs, MMC, SD (secure digital), mini SD, Micro SD, etc.).

Figure 17:
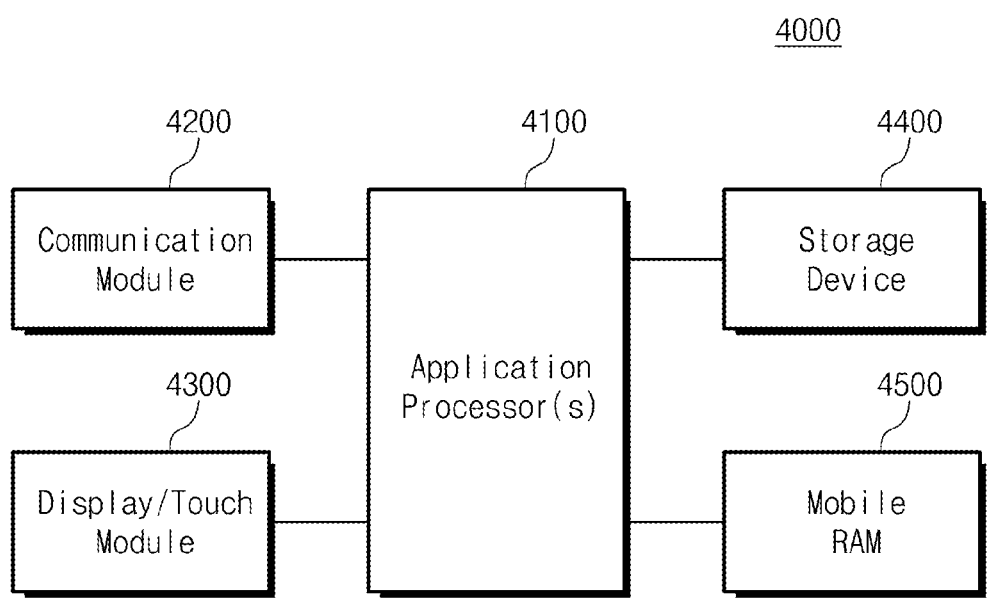
FIG. 17 is a block diagram illustrating a mobile device according to an embodiment of the inventive concept.

FIG. 17 is a block diagram illustrating a mobile device 4000 according to an embodiment of the inventive concept.

Referring to FIG. 17, mobile device 4000 comprises an application processor 4100, a communication module 4200, a display/touch module 4300, a storage device 4400, and a mobile RAM 4500.

Application processor 4100 controls operations of mobile device 4000. Communication module 4200 is implemented to perform wireless or wire communications with an external device. Display/touch module 4300 is implemented to display data processed by application processor 4100 or to receive data through a touch panel. Storage device 4400 is implemented to store user data. Storage device 4400 may be eMMC, SSD, UFS device, etc. Storage device 4400 may comprise a nonvolatile memory device 100 shown in FIG. 1, a nonvolatile memory device 200 shown in FIG. 7 or a nonvolatile memory device 300 shown in FIG. 10.

Mobile RAM 4500 temporarily stores data used for processing operations of mobile device 4000.

It may be beneficial to implement a small-sized mobile device 4000 by improving the degree of freedom on lines to improve a layout.

A memory system or a storage device according to an embodiment of the inventive concept may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:
1. A nonvolatile memory device, comprising:
multiple memory blocks each comprising multiple memory cells arranged at intersections of wordlines and bitlines;
an address decoder configured to electrically connect first lines to wordlines of one of the memory blocks in response to an address;
a line selection switch circuit configured to electrically connect the first lines to second lines in different configurations according to the address;
a source interface decoder configured to provide the second lines with wordline voltages; and a voltage generator configured to generate the wordline voltages, wherein the address decoder comprises multiple block selection transistors for connecting one of the first lines and one of the wordlines, and at least two of the block selection transistors share a source region connected to one of the first lines.

2. The nonvolatile memory device of claim 1, wherein the multiple memory blocks share the bitlines.

3. The nonvolatile memory device of claim 1, wherein the at least two block selection transistors comprise a first block selection transistor and a second block selection transistor, wherein the first block selection transistor has a gate region connected to a first block selection wordline, a drain region connected to a first wordline of a first memory block and the source region, and wherein the second block selection transistor has a gate region connected to a second block selection wordline different from the first block selection wordline, a drain region connected to a second wordline of a second memory block different from the first memory block and the source region.

4. The nonvolatile memory device of claim 1, wherein the line selection switch circuit comprises multiple line selection switches, each line selection switch including;

a first transistor connecting one of the second lines and one of the first lines in response to a first line enable signal;

a second transistor connecting one of remaining second lines other than the one first line and the one first line in response to a second line enable signal;

a pull-up transistor connecting a power supply voltage to the one first line in response to a first line power signal; and a pull-down transistor connecting a ground voltage to the one first line in response to a first line ground signal, wherein the first line enable signal and the second line enable signal are generated based on the address.

5. The nonvolatile memory device of claim 4, wherein bodies of the first and second transistors and the pull-up and pull-down transistors are connected to a negative voltage terminal.

6. The nonvolatile memory device of claim 1, wherein the line selection switch circuit comprises multiple line selection switches, each line selection switch including;

three or more transistors connecting one of three or more of the second lines to one of the first lines in response to line enable signals;

a pull-up transistor connecting a power supply voltage to the one first line in response to a first line power signal; and a pull-down transistor connecting a ground voltage to the one first line in response to a first line ground signal, wherein the line enable signals are generated based on the address.

7. The nonvolatile memory device of claim 1, wherein the line selection switch circuit comprises:

a first line selection circuit connected to wordlines of even-numbered memory blocks of the memory blocks; and a second line selection circuit connected to wordlines of odd-numbered memory blocks of the memory blocks.

8. The nonvolatile memory device of claim 1, wherein the memory blocks constitute at least two mats, and each of the mats shares a common source line through multiple metal lines.

9. A nonvolatile memory device, comprising:

multiple memory blocks each comprising multiple memory cells arranged at intersections of wordlines and bitlines;

a first address decoder configured to electrically connect first lines to wordlines of one of even-numbered memory blocks of the memory blocks according to an address;

a second address decoder configured to electrically connect the first lines to wordlines of one of odd-numbered memory blocks of the memory blocks according to the address;

a first line selection switch circuit configured to electrically connect the first lines of the first address decoder to second lines;

a second line selection switch circuit configured to electrically connect second lines of the second address decoder to the second lines;

a line converter configured to electrically connect the second lines to third lines in different configurations according to the address;

a source interface decoder configured to provide the third lines with wordline voltages; and a voltage generator configured to generate the wordline voltages.

10. The nonvolatile memory device of claim 9, wherein each of the first and second line selection switch circuits comprises multiple line selection switches, each line selection switch including;

a transistor connecting one of the second lines and one of the first lines in response to line enable signals;

a pull-up transistor connecting a power supply voltage to the one first line in response to a first line power signal; and a pull-down transistor connecting a ground voltage to the one first line in response to a first line ground signal.

11. The nonvolatile memory device of claim 9, wherein the line converter comprises multiple line conversion switches, each line conversion switch including at least two transistors connecting one of at least two of the third lines to one of the second lines in response to line enable signals.

12. A method of operating a nonvolatile memory device, comprising:

generating wordline voltages;

applying the wordline voltages to source lines;

electrically connecting the source lines to source interface lines in different configurations according to whether an address is an even-numbered address or an odd-numbered address; and connecting the source interface lines to wordlines of different memory blocks corresponding to the different addresses.

13. The method of claim 12, wherein when the address is the even-numbered address, the source lines are electrically connected to the source interface lines in forward order, and when the address is the odd-numbered address, the source lines are electrically connected to the source interface lines in reverse order.

14. The method of claim 12, further comprising:

applying a power supply voltage to source interface lines of a memory block unselected by the address.

15. The method of claim 12, further comprising:

connecting the source interface lines to a ground voltage in response to a ground enable signal.

* * * * *